(12) United States Patent
Ohkura

(10) Patent No.: US 7,626,410 B2
(45) Date of Patent: Dec. 1, 2009

(54) APPARATUS FOR TESTING A SEMICONDUCTOR DEVICE

(75) Inventor: Yoshihiro Ohkura, Iwata (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 11/860,229

(22) Filed: Sep. 24, 2007

(65) Prior Publication Data

US 2008/0094094 A1    Apr. 24, 2008

(30) Foreign Application Priority Data

Sep. 25, 2006  (JP) .............................. 2006-258487

(51) Int. Cl.
*G01R 31/26* (2006.01)
*G01R 31/28* (2006.01)

(52) U.S. Cl. ..................................... 324/765; 324/158.1
(58) Field of Classification Search .................. 324/765, 324/158.1
See application file for complete search history.

(56) References Cited

U.S. PATENT DOCUMENTS

| | | | | |
|---|---|---|---|---|
| 4,872,850 | A | | 10/1989 | Mogi et al. |
| 4,899,107 | A | * | 2/1990 | Corbett et al. ............... 324/765 |
| 5,302,891 | A | * | 4/1994 | Wood et al. .................. 324/765 |
| 5,572,140 | A | * | 11/1996 | Lim et al. ..................... 324/755 |
| 6,025,732 | A | * | 2/2000 | Foo et al. ..................... 324/760 |
| 6,297,654 | B1 | * | 10/2001 | Barabi ......................... 324/755 |
| 6,561,823 | B1 | * | 5/2003 | Konno .......................... 439/91 |

FOREIGN PATENT DOCUMENTS

| | | |
|---|---|---|
| JP | 62-111673 | 7/1987 |
| JP | 2002-342522 | 11/2002 |

* cited by examiner

*Primary Examiner*—Ha Tran T Nguyen
*Assistant Examiner*—Karen M Kusumakar
(74) *Attorney, Agent, or Firm*—Dickstein Shapiro LLP

(57) ABSTRACT

An apparatus for testing a semiconductor device that has opposing first and second sides is provided. The semiconductor device includes at least one functional unit on the first side and a plurality of terminals on the second side. The apparatus may include, but is not limited to, a mounting structure, and a plurality of electrodes. The mounting structure has at least one stage that is configured to allow the semiconductor device to be mounted thereon. The mounting structure has a communicating hole that penetrates the mounting structure from the stage. The communicating hole allows the at least one functional unit to face to the communicating hole while the semiconductor device is mounted on the stage. Each of the plurality of electrodes is configured to be contactable to a corresponding one of the plurality of terminals, while the semiconductor device is mounted on the stage.

5 Claims, 7 Drawing Sheets

APPARATUS FOR TESTING A SEMICONDUCTOR DEVICE

BACKGROUND OF THE INVENTION

1. Field of the Invention

The present invention generally relates to an apparatus for testing a semiconductor device. More specifically, the present invention relates to a tester for testing a semiconductor device, and the tester includes one or more functional units in a first side and one or more terminals in a second side.

Priority is claimed on Japanese Patent Application No. 2006-258487, filed Sep. 25, 2006, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

A semiconductor device can be manufactured by processes that may include, but are not limited to, a device preparation process, a dicing process, a bonding process and a packaging process. A test can be performed for confirming that a semiconductor device has one or more predetermined function, after every manufacturing process has been completed. A final test for the semiconductor device as the final product can, for example, be performed after the packaging process has been completed. In some cases, the semiconductor device as the final product may be an IC with external terminals or an LSI with external terminals. In those cases, after the packaging process has been completed, the final product can be mounted on a socket to allow performing the final test for the final product.

In general, the semiconductor device may include a body and terminals. The body has a packaged element. The terminals may project from the body or may be provided on the surface of the body. The terminals of the semiconductor device are electrically connected to electrodes of a tester. The semiconductor device as a test target is carried by a handler as a carrier to the socket of the tester. The handler can be cylindrically shaped. The handler has a first side portion that is configured to catch or handle the semiconductor device. When the first side portion of the handler becomes contact with the semiconductor device, the internal pressure of the cylindrically shaped handler is reduced so that the semiconductor device is handled by the handler. The semiconductor device is carried to the socket of the tester by the handler.

Some semiconductor devices may have a plate-like shape that has opposing first and second sides that are distanced in a thickness direction. The semiconductor device may include one or more functional units in the first side and terminals in the second side. The terminals are electrically connected to the one or more functional units. Typical examples of the semiconductor device with the functional units and the terminals may include, but are not limited to, a silicon microphone and a CMOS sensor. The silicon microphone is manufactured by semiconductor manufacturing processes. The silicon microphone has opposing first and second sides that are distanced in a thickness direction. A diaphragm or a vibration film as a functional unit is provided in the first side of the silicon microphone. The CMOS sensor also has opposing first and second sides that are distanced in a thickness direction. A light receiving element or a photo detector as a functional unit is provided on the first side of the CMOS sensor.

As described above, the semiconductor device includes one or more functional units in the first side and terminals in the opposing second side. The tester for testing the semiconductor device includes a stage that has electrodes that are configured to allow the terminals of the semiconductor device becomes contact with the electrodes when the semiconductor device is amounted on the stage. The semiconductor device is carried by the handler to the stage of the tester and mounted on the stage whereby the terminals of the semiconductor device become contact with the electrodes that are disposed on the stage.

The terminals of the semiconductor device face toward the stage of the tester, while the functional unit of the semiconductor device faces toward the handler. Namely, the handler covers the functional unit of the semiconductor device when the handler catches the semiconductor device. For performing the final test for the silicon microphone, it is necessary to apply a predetermined acoustic pressure to the diaphragm or the vibration film as a functional unit of the silicon microphone. Since the handler covers the diaphragm or the vibration film as a functional unit of the silicon microphone, it is difficult to apply the predetermined acoustic pressure to the diaphragm or the vibration film. The handler absorbs and carries the semiconductor device, while the handler has a reduced internal pressure. It is impermissible to make any hole in the side wall of the handler. Thus, it is difficult to provide the handler with any acoustic pressure applicator that applies an acoustic pressure to the diaphragm or the vibration film of the silicon microphone. The acoustic pressure applicator needs to be provided for applying the acoustic pressure to the diaphragm or the vibration film of the silicon microphone, after the semiconductor device has been carried to the tester by the handler. This needs additional test process and time for performing the test for the semiconductor device.

In view of the above, it will be apparent to those skilled in the art from this disclosure that there exists a need for an improved tester. This invention addresses this need in the art as well as other needs, which will become apparent to those skilled in the art from this disclosure.

SUMMARY OF THE INVENTION

Accordingly, it is a primary object of the present invention to provide an apparatus for testing a semiconductor device.

It is another object of the present invention to provide a tester for testing a semiconductor device that includes one or more functional units and one or more terminals, wherein the one or more functional units are provided in an opposite side to a side on which the terminals are provided, and the tester is configured to perform the test in a short time and a reduced number of test process.

In accordance with a first aspect of the present invention, an apparatus for testing a semiconductor device that has opposing first and second sides is provided. The semiconductor device includes at least one functional unit on the first side and a plurality of terminals on the second side. The apparatus may include, but is not limited to, a mounting structure, and a plurality of electrodes. The mounting structure has at least one stage that is configured to allow the semiconductor device to be mounted thereon. The mounting structure has a communicating hole that penetrates the mounting structure from the stage. The communicating hole allows the at least one functional unit to face to the communicating hole while the semiconductor device is mounted on the stage. Each of the plurality of electrodes is configured to be contactable to a corresponding one of the plurality of terminals, while the semiconductor device is mounted on the stage.

The at least one functional unit of the semiconductor device that is mounted on the stage faces to a first side opening of the communicating hole, wherein the first side opening is positioned on the stage. A test condition such as a sound test signal or an optical test signal is given to the at least one functional unit through the communicating hole. If the semiconductor device is a silicon microphone, the sound test signal is given to the at least one functional unit. If the semiconductor device is a CMOS sensor, the optical test signal is given to the at least one functional unit.

Each of the plurality of electrodes is configured to be contactable to a corresponding one of the plurality of terminals of the semiconductor device that is mounted on the stage. The plurality of terminals are disposed on the second side opposing to the first side on which the at least one functional unit is disposed. The semiconductor device is carried to the apparatus and mounted on the stage of the mounting structure so that the at least one functional unit faces to the communicating hole. A carrier can carry the semiconductor device without covering the at least one functional unit. This does not disturb performing the test processes. The processes for mounting the semiconductor device on the stage and having each of the plurality of electrodes contacts with a corresponding one of the plurality of terminals of the semiconductor device are necessary to start the test process for testing the semiconductor device. Shortened time and reduced number of processes are necessary to start the test process for testing the semiconductor device.

The apparatus may further include, but is not limited to, a cover that covers the semiconductor device that is mounted on the stage, so that the semiconductor device is positioned between the cover and the communicating hole.

The second side of the semiconductor device is covered by the cover, wherein the plurality of terminals are disposed on the second side which is opposite to the first side on which the at least one functional unit is disposed. The cover can shield the semiconductor device from incidence of unnecessary sounds or light, while the test condition such as a sound test signal or an optical test signal can be supplied through the communicating hole to the at least one functional unit. The cover can improve the accuracy in testing the semiconductor device.

The apparatus may further include, but is not limited to, a supporter that supports the mounting structure and allows the mounting structure to move in a direction vertical to the surface of the stage. Each of the plurality of electrodes can be configured to approach a corresponding one of the plurality of terminals by moving the mounting structure in the vertical direction.

The mounting structure is supported by the supporter, provided that the mounting structure is movable in the vertical direction. Each of the plurality of electrodes approaches a corresponding one of the plurality of terminals in cooperation with the motion of the mounting structure in the vertical direction. For example, the processes for mounting the semiconductor device on the stage of the mounting structure and moving the mounting structure in the vertical direction cause each of the plurality of electrodes to approach and contact with a corresponding one of the plurality of terminals. The simplified processes in shortened time are necessary to start the test process.

Each of the plurality of electrodes may further include, but is not limited to, a flexible portion that is deformable, and first and second portions. The first portion has a power point. The first portion is connected to the flexible portion. The power point receives mechanical force from the mounting structure, thereby deforming the flexible portion. The second portion has a contact portion. The second portion is connected to the flexible portion. The contact portion of each of the plurality of electrodes becomes contact with a corresponding one of the plurality of terminals while the flexible portion being deformed. The power point is pushed down by moving the mounting structure downwardly, so as to deform the flexible portion and rotate the first and second portions around the flexible portion, thereby causing the contact portion of each of the plurality of electrodes to become contact with a corresponding one of the plurality of terminals.

The mounting structure is moved in the vertical direction, while the mounting structure pushing the power point downwardly, so that the flexible portion is deformed while the first and second portions rotate around the deforming flexible portion, whereby the contact portion of each of the plurality of electrodes approaches and contacts with a corresponding one of the plurality of terminals. The liner motion of the mounting structure in the vertical direction is converted into the rotational motion of the first and second portions around the flexible portion, thereby having the contact portion of each of the plurality of electrodes approach and contact with a corresponding one of the plurality of terminals. The simplified structure of the apparatus can realize the simplified processes for preparing the apparatus to start the test process. Shortened time and reduced number of processes are necessary to start the test process for testing the semiconductor device.

The apparatus may further include, but is not limited to, a carrier that carries the semiconductor device to the stage. The carrier is configured to cause the mounting structure to move in the vertical direction. The carrier performs two different functions. The first function is to carry the semiconductor device to the apparatus and mounting the semiconductor device on the stage of the mounting structure. The second function is to cause the mounting structure to move in the vertical direction. The motion of the mounting structure in the vertical direction will cause each of the plurality of electrodes to approach and contact with a corresponding one of the plurality of terminals. The simplified processes in shortened time are necessary to start the test process.

The cover may have a plurality of electrodes. Each of the plurality of electrodes becomes contact with a corresponding one of the plurality of terminals while the cover is disposed to cover the semiconductor device. The processes for mounting the semiconductor device on the stage and disposing the cover to cover the semiconductor device prepare the test process. The simplified processes in shortened time with the simplified structure of the test apparatus are necessary to start the test process.

These and other objects, features, aspects, and advantages of the present invention will become apparent to those skilled in the art from the following detailed descriptions taken in conjunction with the accompanying drawings, illustrating the embodiments of the present invention.

BRIEF DESCRIPTION OF THE DRAWINGS

Referring now to the attached drawings which form a part of this original disclosure.

DETAILED DESCRIPTION OF THE INVENTION

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 1:
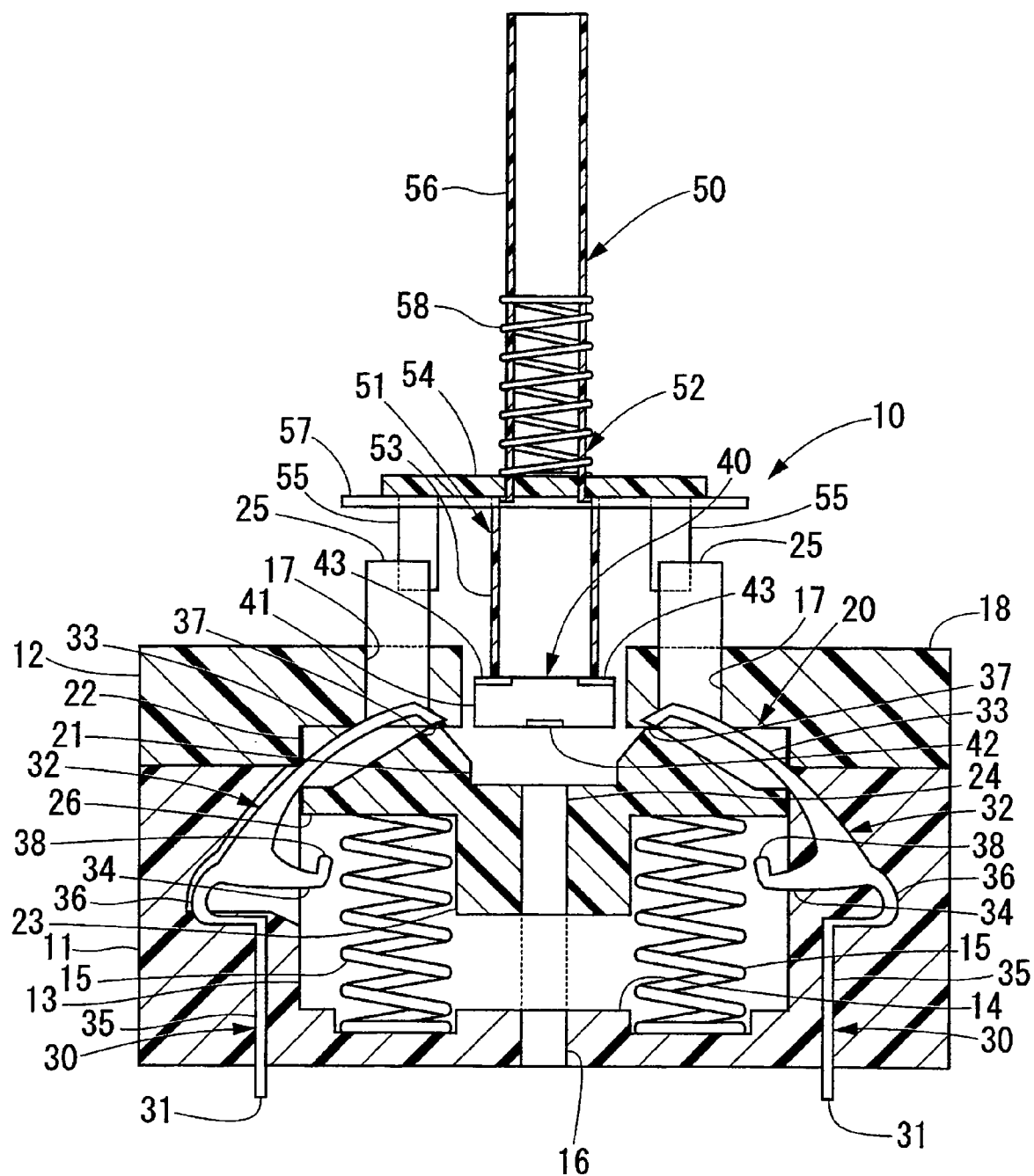
FIG. 1 is a cross sectional view illustrating a tester in accordance with a first preferred embodiment of the present invention.

FIG. 1 is a cross sectional view illustrating a tester in accordance with a first preferred embodiment of the present invention. A tester 10 is configured to test a semiconductor device 40 that is carried by a handler 50. The tester may include, but is not limited to, a housing 11, a cover 12, a floating 20, contact frames 30, and a handler 50. The housing 11 in combination with the cover 12 provides a container 13 that contains the floating 20. The floating 20 is configured to allow the semiconductor device 40 to be mounted thereon for performing a predetermined test for the semiconductor device 40. Namely, the floating 20 may perform as a stage on which the semiconductor device 40 is mounted for performing the test for the semiconductor device 40. Each of the contact frames 30 may perform as an electrode that electrically contacts with a corresponding one of terminals of the semiconductor device 40.

The floating 20 has opposing first and second sides that are distanced in a direction vertical to surfaces of the semiconductor device 40. For example, the first side faces downwardly, while the second side faces upwardly as illustrated in FIG. 1. The floating 20 may include a stage 21 that is configured to allow the semiconductor device 40 to be mounted thereon. The stage 21 is positioned in the second side of the floating 20. The floating 20 may include a plate-shaped portion 22 and a cylindrically shaped portion 23. The plate-shaped portion 22 is positioned in the second side of the floating 20. The cylindrically shaped portion 23 is positioned in the first side of the floating 20. The plate-shaped portion 22 is positioned closer to the cover 12 than the cylindrically shaped portion 23. The cylindrically shaped portion 23 is positioned closer to the bottom portion of the housing 11 than the plate-shaped portion 22. The plate-shaped portion 22 has a depressed portion that performs as the stage 21 on which the semiconductor device 40 is mounted. The cover 12 covers the first side of the floating 20.

The floating 20 has a communicating hole 24 that extends from the stage 21 to the bottom of the cylindrically shaped portion 23. The communicating hole 24 is directed toward the bottom wall 14 of the housing 11. Namely, the communicating hole 24 penetrates the plate-shaped portion 22 and the cylindrically shaped portion 23 in the vertical direction.

The floating 20 is contained in an internal empty space of the container 13 that is provided by the combined housing 11 and cover 12. The floating 20 is supported by a supporter that is further supported by the housing 11 so that the floating 20 is movable in the vertical direction. There is a gap between the plate-shaped portion 22 and the inner wall of the housing 11 so as to allow the floating 20 to be movable in the vertical direction. The floating 20 can be mechanically supported on the bottom wall 14 of the housing 11. For example, the floating 20 can be mechanically supported by one or more elastic-force applicators that apply an elastic force to the floating 20 toward the cover 12. The one or more elastic-force applicators can be realized by, but are not limited to, mechanical spring members such as coil springs 15. The coil springs 15 are provided between the plate-shaped portion 22 and the bottom wall 14 of the housing 11. Namely, the coil springs 15 each have first and second ends, wherein the second end contacts with the bottom surface of the plate-shaped portion 22 and the first end contacts with a bottom wall 14 of the housing 11. The coil springs 15 apply elastic force to the plate-shaped portion 22 of the floating 20 upwardly. Namely, the floating 20 is forced by the coil springs 15 upwardly so that the floating 20 is reciprocally movable in the vertical direction. Instead of the coil springs 15, any other supporter can be used which supports the floating 20 and allows the floating 20 to be reciprocally movable in the vertical direction.

The bottom wall 14 of the housing 11 has a communicating hole 16 which communicates between the inner space of the container 13 and the outside of the tester 10. The communicating holes 16 and 24 extend along a vertical axis which is virtual. The communicating hole 16 of the housing 11 is aligned to the communicating hole 24 of the floating 20. When the floating 20 becomes contact with the housing 11, the communicating holes 16 and 24 are coupled to each other, thereby forming a single communicating hole.

The floating 20 may include plural projecting portions 25 which project upwardly or in a vertical direction. The projecting portions 25 penetrate through insertion holes 17 of the cover 12. The projecting portions 25 have a diameter which is slightly smaller than an inner diameter of the insertion holes 17 so as to allow the projecting portions 25 to move relative to the cover 12 and in the vertical direction. The projecting portions 25 are integrated into the floating 20. Namely, the projecting portions 25 are united with the plate-shaped portion 22. Application of a downward force to the projecting portions 25 toward the bottom wall 14 of the housing 11 pushes the floating 20 downwardly so that the floating 20 moves toward the bottom wall 14.

The contact frames 30 are provided inside the housing 11 and the cover 12. The contact frames 30 are positioned diametrically outside the semiconductor device 40 so that the contact frames 30 are adjacent to the periphery of the semiconductor device 40. The contact frames 30 may be made of a conductive material, for example, metals such as copper, aluminum, and brass.

Each of the contact frames 30 may include a lead portion 35 having a first edge 31, a flexible portion 36 and an arm portion 32. The flexible portion 36 has first and second edges. The lead portion 35 extends from the first edge of the flexible portion 36 downwardly so that the lead portion 35 penetrates the housing 11 and the first edge 31 of the lead portion 35 projects outside from the bottom wall 14 of the housing 11. The first edge 31 can be electrically connected to an external device. The arm portion 32 extends from the second edge of the flexible portion 36 upwardly and inwardly. The arm portion 32 has a modified V-shape. Namely, the arm portion 32 includes a base, and first and second branched arms 33 and 34 that extend from the base. The first branched arm 33 extends upwardly and inwardly. The first branched arm 33 extends over the second branched arm 34. The first branched arm 33 extends toward the semiconductor device 40 from the side wall of the housing 11. The first branched arm 33 has a contact portion 37 that is configured to be contactable with the semiconductor device 40. The second branched arm 34 may be shorter than the first branched arm 33. The second branched arm 34 extends under the first branched arm 33. The second branched arm 34 has a power point 38 that is configured to be contactable with the bottom wall 26 of the plate-shaped portion 22 of the floating 20.

The flexible portion 36 may typically be formed in, but is not limited to, generally U-shape. The first edge of the flexible portion 36 is coupled to the lead portion 35. The second edge of the flexible portion 36 is coupled to the base of the arm portion 32. Modification of the shape of the flexible portion 36 can be permissible provided that the flexible portion 36 has mechanical flexibility such that the arm portion 32 moves upwardly and downwardly relative to the lead portion 35.

The first branched arm 33 is positioned closer to the cover 12 than the second branched arm 34. The first branched arm 33 extends from the base upwardly and inwardly. The first branched arm 33 has the contact portion 37 as a free end. The second branched arm 34 is positioned closer to the bottom wall 14 of the housing 11 than the first branched arm 33. The second branched arm 34 has the power point 38 as a free end. When the floating 20 moves toward the bottom wall 14 of the housing 11, the bottom wall 26 of the plate-shaped portion 22 of the floating 20 becomes contact with the power point 38 and pushes the power point 38 downwardly, whereby the arm portion 32 moves downwardly, while the flexible portion 36 is deformed by the applied force to the power point 38. When the floating 20 moves toward the bottom wall 14 of the housing 11, the first branched arm 33 moves downwardly, while the flexible portion 36 is deformed by the applied force to the power point 38.

The tester 10 may also include the handler 50. The handler 50 is configured to carry the semiconductor device 40. The handler 50 may include a suction unit 51 and a carrying unit 52. The suction unit 51 includes a suction pipe 53. The suction pipe 53 may be cylindrically shaped. The suction pipe 53 has a first end portion that is configured to contact with the semiconductor device 40 as a test target. The suction pipe 53 has an opposing second end portion that is connected to a depressurizing unit. The depressurizing unit is not illustrated. The suction pipe 53 becomes contact with the semiconductor device 40, and the suction pipe 53 catches the semiconductor device 40 by suction force, while the depressurizing unit performs a depressurizing operation. When the depressurizing operation of the depressurizing unit is discontinued, the semiconductor device 40 is released from the suction pipe 53 and mounted to the stage 21 of the floating 20.

The suction unit 51 also includes a holder plate 54 that extends horizontally. The holder plate 54 has a larger diameter than that of the suction pipe 53. The holder plate 54 has a side portion that extends around the suction pipe 53. The holder plate 54 can be coupled to the second end portion of the suction unit 51. The holder plate 54 can be united with the suction unit 51. The suction unit 51 also includes projecting portions 55 which project downwardly from the side portion of the suction pipe 53. The projecting portions 55 are coupled to the side portion of the suction pipe 53. Each of the projecting portions 55 has first and second ends opposing to each other. The second end of the projecting portion 55 is fixed to the side portion of the suction pipe 53. The first end of the projecting portion 55 is configured to be contactable with a top surface 18 of the cover 12. The top surface 18 faces opposing to the housing 11. Namely, the projecting portion 55 is contactable with the cover 12. The suction unit 51 can be configured to be movable relative to the cover 12. The suction unit 51 can be configured to be movable toward the floating 20 until the projecting portions 55 become contact with the top surface 18 of the cover 12.

The carrying unit 52 may include a carrying arm 56 and a holder plate 57. The carrying arm 56 can be united to the holder plate 57. The holder plate 57 has opposing first and second surfaces. The first surface of the holder plate 57 faces to the suction pipe 53. The second surface of the holder plate 57 contacts with the holder plate 54. The carrying arm 56 extends from the second surface of the holder plate 57 upwardly. The carrying unit 52 supports the section unit 51 via the holder plate 57. The holder plate 54 of the section unit 51 is forced to the holder plate 57 of the carrying unit 52. For example, the holder plate 57 can be forced to the holder plate 54 by elastic force. The carrying unit 52 may include a coil spring 58 that is supported by the carrying arm 56. The coil spring 58 applies elastic force to the holder plate 54 downwardly, thereby forcing the holder plate 54 of the section unit 51 to the holder plate 57 of the carrying unit 52. The suction pipe 53 and the projecting portions 55 are fixed to the holder plate 54. The suction pipe 53 and the projecting portions 55 penetrate the holder plate 57. The suction pipe 53 and the projecting portions 55 project from the holder plate 57 downwardly.

The section unit 51 and the carrying unit 52 move relative to each other along a vertical axis. The handler 50 moves toward the bottom wall 14 of the housing 11, while the holder plates 54 and 57 contact with each other, and the suction unit 51 moves together with the carrying unit 52. Moving the suction unit 51 together with the carrying unit 52 toward the floating 20 is permissible until the projecting portions 55 contact with the top surface 18 of the cover 12. After the projecting portions 55 have contacted with the top surface 18 of the cover 12, moving the suction unit 51 toward the floating 20 is impermissible, while moving the carrying unit 52 toward the floating 20 is permissible. The carrying unit 52 moves toward the bottom wall 14 of the housing 11 separately from the suction unit 51, while the suction unit 51 remains unchanged at the position such that the projecting portions 55 are in contact with the top surface 18 of the cover 12.

The holder plate 57 of the carrying unit 52 is contactable with the projecting portions 25 of the floating 20. The holder plate 57 of the carrying unit 52 can be made into contact with the projecting portions 25 of the floating 20, while the projecting portions 55 become contact with the top surface 18 of the cover 12. The carrying unit 52 together with the holder plate 57 can further be moved toward the bottom wall 14 of the housing 11, while the suction unit 51 together with the holder plate 54 remaining unchanged at the position such that the projecting portions 55 are in contact with the top surface 18 of the cover 12. The carrying unit 52 is moved together with the suction unit 51 until the projecting portions 55 become contact with the top surface 18 of the cover 12. After the projecting portions 55 become contact with the top surface 18 of the cover 12, the carrying unit 52 is moved separately from the suction unit 51, while the holder plate 57 of the carrying unit 52 pushes down the projecting portions 25 of the floating 20. Namely, the carrying unit 52 is moved downwardly, while the carrying unit 52 pushing down the floating 20 that is upwardly applied with elastic force by the coil springs 13. The downward force that is applied to the floating 20 by the carrying unit 52 exceeds elastic force by the coil springs 13, whereby the floating 20 moves toward the bottom wall 14 of the housing 11.

The carrying unit 52 is further moved downwardly to push down the floating 20 so that the bottom wall 26 of the plate-shaped portion 22 of the floating 20 becomes contact with the power points 38 of the second branched arms 34 of the contact frames 30. Furthermore, the carrying unit 52 is continued to be moved downwardly to further push down the floating 20 and the power points 38 of the second branched arms 34 of the arm portions 32 of the contact frames 30, while the flexible portions 36 of the contact frames 30 are deformed, and the first branched arm 33 of the arm portions 32 are moved downwardly and inwardly. Namely, the arm portion 32 further inclines inwardly, while the floating 20 pushes the power points 38 down.

A typical example of the test target may include, but is not limited to, the semiconductor device 40. The semiconductor device 40 has opposing first and second surfaces. The second surface faces upwardly or toward the handler 50, while the first surface faces downwardly or toward the stage 21 of the floating 20. The semiconductor device 40 may include a body 41, a function unit 42 that is disposed on the first surface thereof, and terminals 43 that are disposed on the second surface thereof. Namely, the function unit 42 is provided on the surface opposing to the surface on which the terminals 43 are provided. Typical examples of the semiconductor device 40 including the function unit 42 and the terminals 43 on opposing surfaces may include, but are not limited to, silicon microphones, CMOS sensors, pressure sensors, and flow sensors. The silicon microphone has a vibration unit as the functional unit 42. The CMOS sensor has a light receiving element, for example, a photo-detector as the functional unit 42. The pressure sensor or the flow sensor may have a pressure cell as the functional unit 42 that receives applied pressure.

Figure 2:
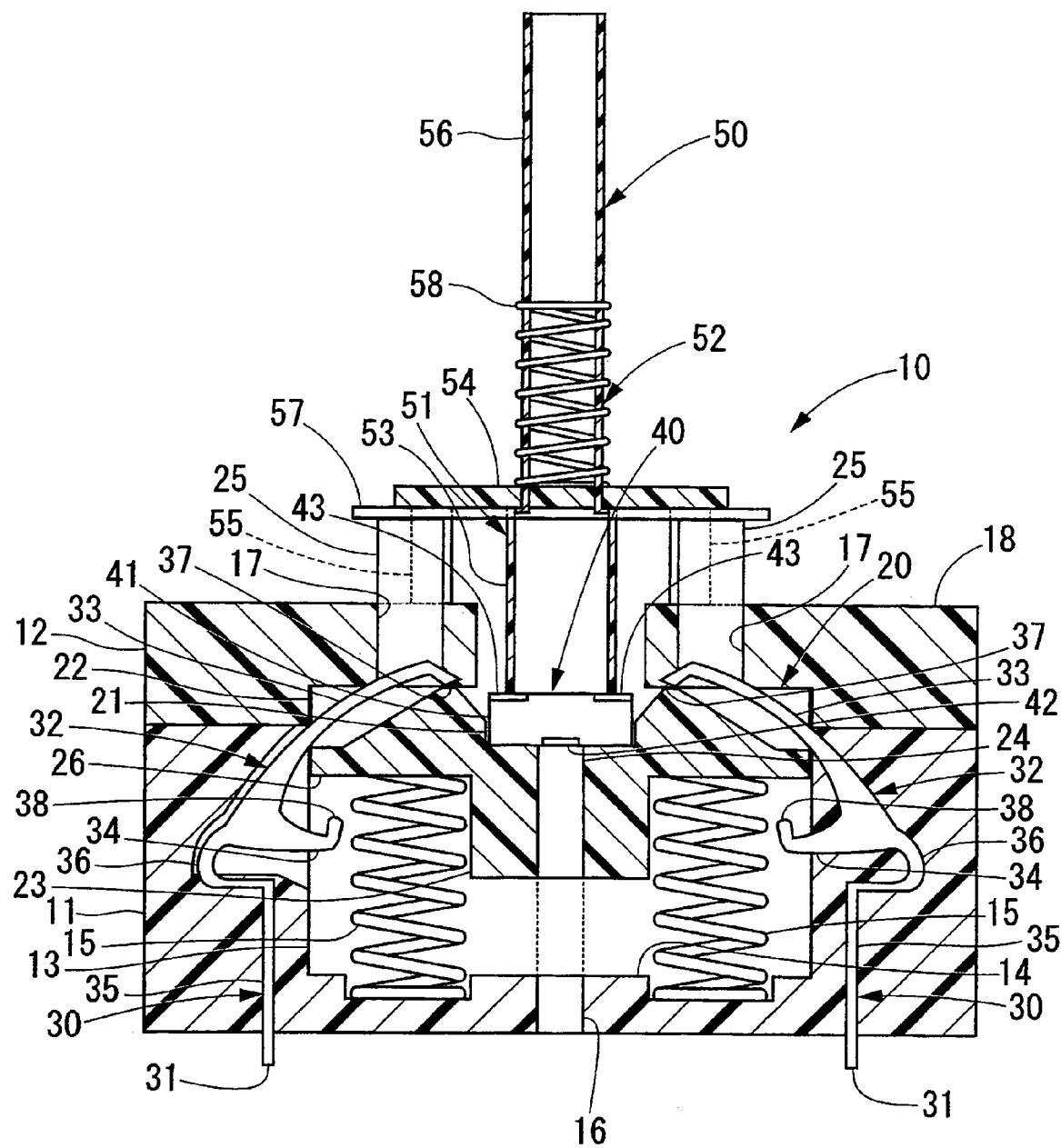
FIG. 2 is a cross sectional view illustrating a tester in a sequential step involved in a carrying process for carrying a test target to a tester in accordance with the first preferred embodiment of the present invention.
Figure 3:
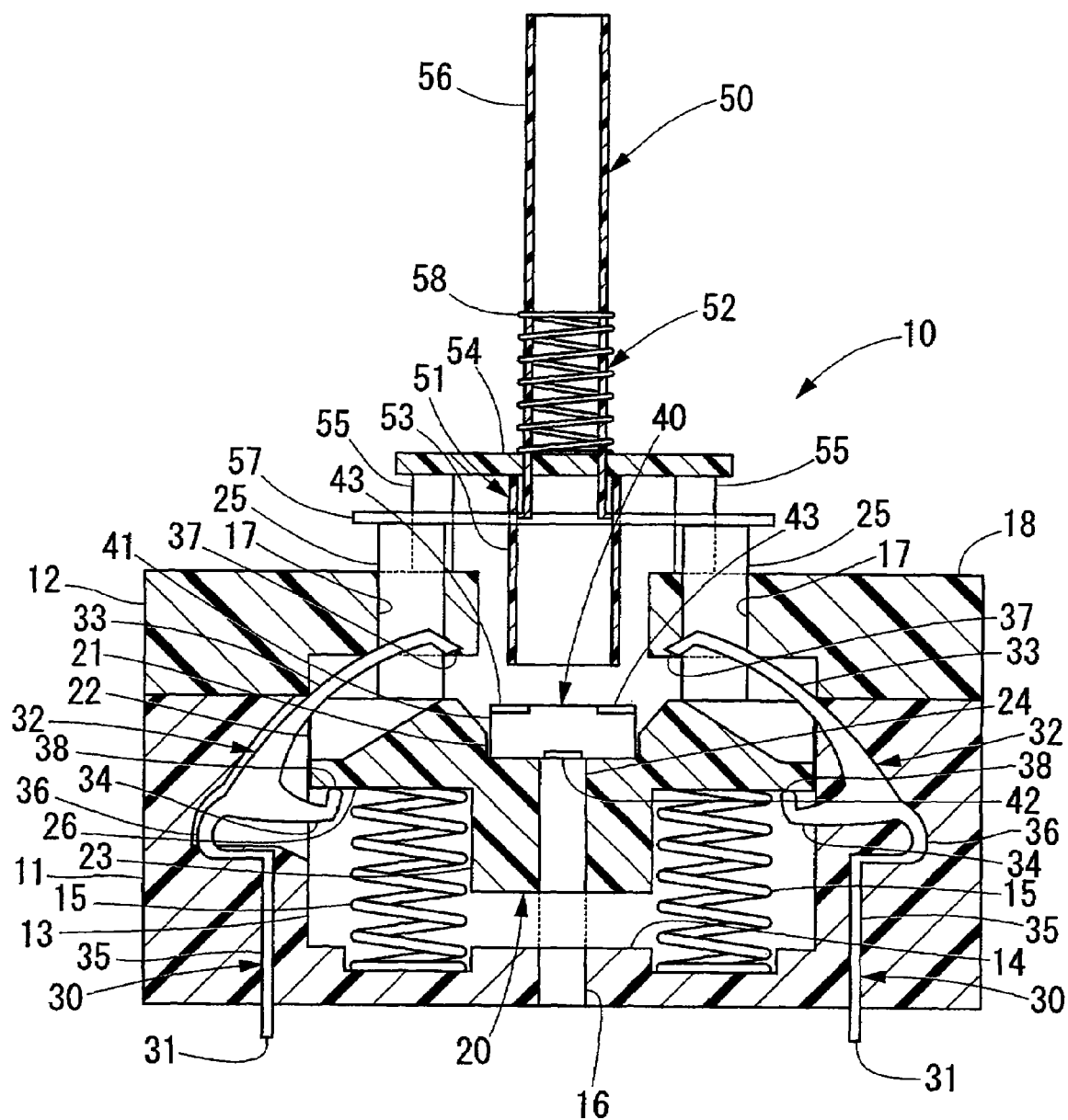
FIG. 3 is a cross sectional view illustrating a tester in a sequential step, after the step of FIG. 2, in accordance with the first preferred embodiment of the present invention.
Figure 4:
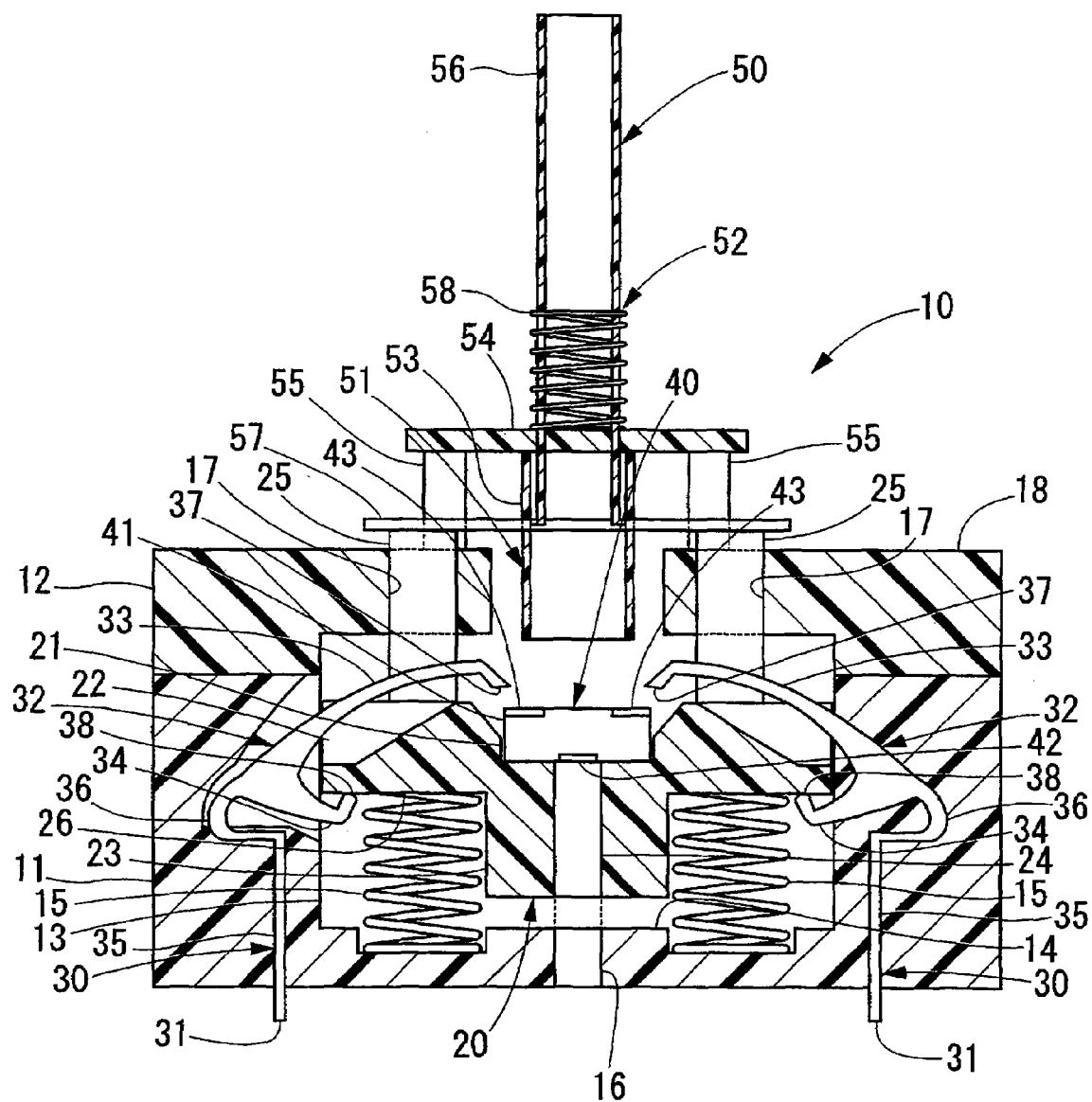
FIG. 4 is a cross sectional view illustrating a tester in a sequential step, after the step of FIG. 3, in accordance with the first preferred embodiment of the present invention.
Figure 5:
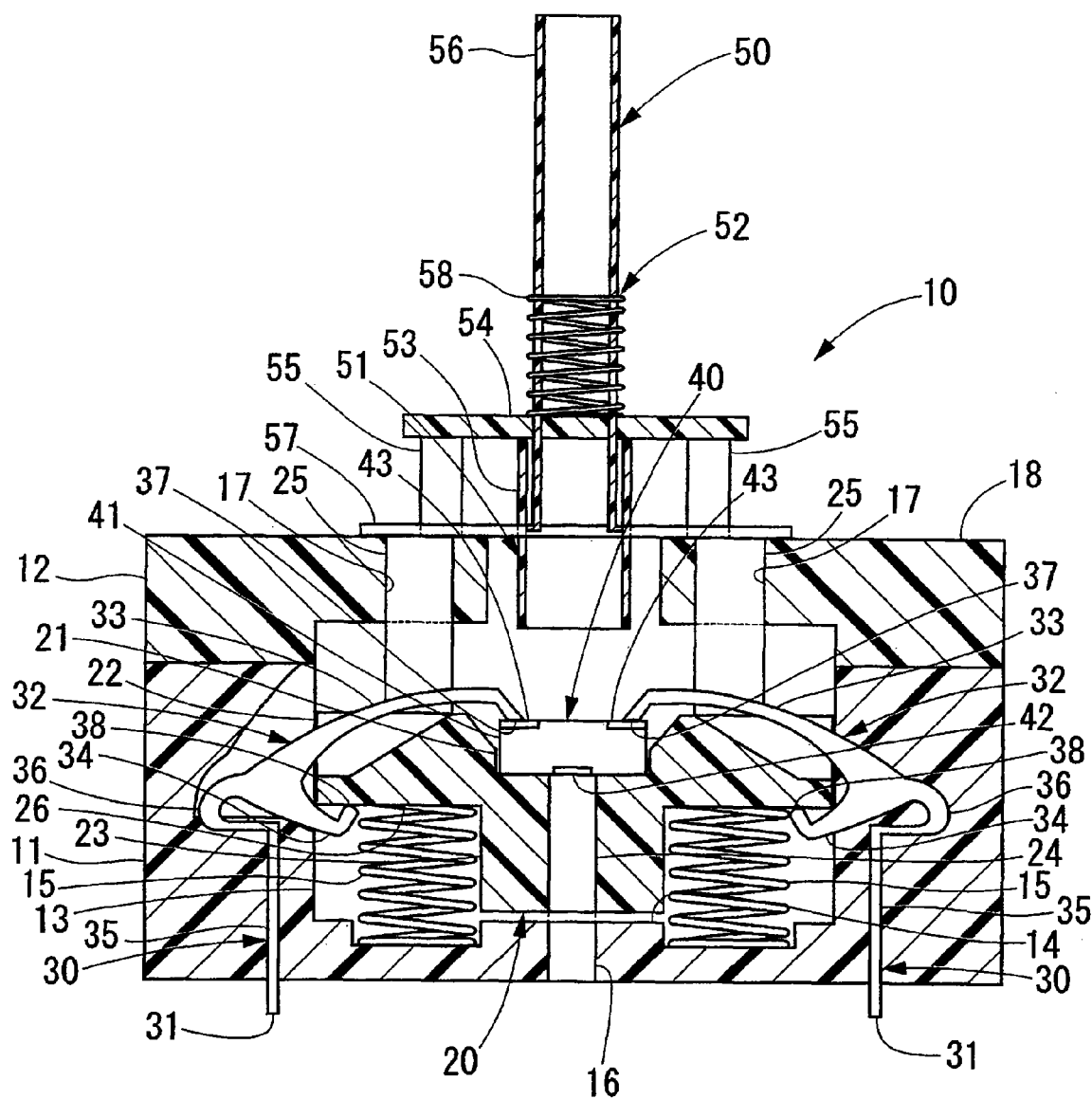
FIG. 5 is a cross sectional view illustrating a tester in a sequential step, after the step of FIG. 4, in accordance with the first preferred embodiment of the present invention.

Operations of the tester 10 and process for testing the semiconductor device 40 will be described. FIG. 2 is a cross sectional view illustrating a tester in a sequential step involved in a carrying process for carrying a test target to a tester in accordance with the first preferred embodiment of the present invention. FIG. 3 is a cross sectional view illustrating a tester in a sequential step, after the step of FIG. 2, in accordance with the first preferred embodiment of the present invention. FIG. 4 is a cross sectional view illustrating a tester in a sequential step, after the step of FIG. 3, in accordance with the first preferred embodiment of the present invention. FIG. 5 is a cross sectional view illustrating a tester in a sequential step, after the step of FIG. 4, in accordance with the first preferred embodiment of the present invention.

The handler 50 carries the semiconductor device 40 to the tester 10 from a container for containing semiconductor devices. The container is not illustrated. The handler 50 is moved to the container that contains the semiconductor device 40. The suction pipe 53 of the handler 50 becomes contact with the semiconductor device 40 as a test target. The depressurizing unit that is connected to the suction pipe 53 operates to depressurize the internal pressure of the suction pipe 53 so that the suction pipe 53 catches the semiconductor device 40 by suction force. The handler 50 carries the semiconductor device 40 from the container to a position over the tester 10. For example, the handler 50 is positioned so that the semiconductor device 40 is positioned over the stage 21 of the floating 20 of the tester 10 as shown in FIG. 1.

As shown in FIG. 2, the handler 50 is moved downwardly so that the semiconductor device 40 is mounted on the floating 20, wherein the carrying unit 52 and the suction unit 53 are moved together downwardly. At this time, the holder plate 57 of the carrying unit 52 becomes contact with the projecting portions 25 of the floating 20, while the projecting portions 55 of the suction unit 53 become contact with the top surface 18 of the cover 12. A further downward moving of the suction unit 53 is impermissible.

The depressurizing unit discontinues the depressurizing operation to discontinue application of suction force to the semiconductor device 40, thereby releasing the semiconductor device 40 from the suction pipe 53. The semiconductor device 40 is mounted on the stage 21 of the floating 20. The functional unit 42 of the semiconductor device 40 faces to the communicating hole 24 of the floating 20, while the terminals 43 of the semiconductor device 40 face upwardly.

The projecting portions 55 of the suction unit 51 in contact with the top surface 18 of the cover 12 prevents the suction unit 51 from being further moved downwardly. The flowing 20 including the projecting portions 25 are movable. The carrying unit 52 together with the holder plate 57 is further moved toward the bottom wall 14 of the housing 11, while the suction unit 51 together with the holder plate 54 remaining unchanged at the position such that the projecting portions 55 are in contact with the top surface 18 of the cover 12. The suction pipe 53 is prevented from pushing the semiconductor device 40 that is mounted on the stage 21 of the flowing 20.

As shown in FIG. 3, the carrying unit 52 is moved separately from the suction unit 51, while the holder plate 57 of the carrying unit 52 pushes down the projecting portions 25 of the floating 20. The carrying unit 52 pushes down the floating 20 that is upwardly applied with elastic force by the coil springs 13. The downward force that is applied to the floating 20 by the carrying unit 52 exceeds elastic force by the coil springs 13, whereby the floating 20 moves downwardly or toward the bottom wall 14 of the housing 11. The carrying unit 52 is further moved downwardly to push down the floating 20 so that the bottom wall 26 of the plate-shaped portion 22 of the floating 20 becomes contact with the power points 38 of the second branched arms 34 of the contact frames 30.

As shown in FIG. 4, the carrying unit 52 is continued to be moved downwardly so that the floating 20 further pushes the power points 38 of the second branched arms 34 of the arm portions 32 of the contact frames 30, while the flexible portions 36 of the contact frames 30 are deformed, and the arm portions 32 of the contact frames 30 are rotated around the deforming flexible portion 36. The rotation of the arm portions 32 around the deforming flexible portions 36 moves the first branched arms 33 of the arm portions 32 downwardly and inwardly so that the contact portions 37 of the first branched arms 33 come closer to the semiconductor device 40. Namely, the arm portions 32 further incline inwardly, while the floating 20 pushes the power points 38 down. The downward force that is applied to the floating 20 by the carrying unit 52 exceeds the sum of the elastic force by the coil springs 13 and another elastic force by the flexible portions 36 of the contact frames 30.

As shown in FIG. 5, the carrying unit 52 is further continued to be moved downwardly to further push down the floating 20 and the power points 38, while the flexible portions 36 of the contact frames 30 are further deformed and the arm portions 32 are further rotated around the deforming flexible portions 36. Each of the contact portions 37 of the first branched arms 33 becomes contact with a corresponding one of the terminals 43 of the semiconductor device 40. After each of the contact portions 37 has contacted with a corresponding one of the terminals 43 of the semiconductor device 40, the carrying unit 52 is further continued to be moved downwardly to further push down the floating 20 and the power points 38 until the bottom of the cylindrically shaped portion 23 of the flowing 20 becomes contact with the upper surface of the bottom wall 14 of the housing 11. When the floating 20 becomes contact with the bottom wall 14 of the housing 11, the communicating hole 16 of the bottom wall 14 of the housing 11 is coupled to the communicating hole 24 of the floating 20, thereby forming a single communicating hole.

The functional unit 42 of the semiconductor device 40 faces to the communicating hole 24 of the floating 20. Each of the contact portions 37 of the first branched arms 33 is in contact with a corresponding one of the terminals 43 of the semiconductor device 40, whereby each of the contact frames 30 is electrically connected to a corresponding one of the terminals 43 of the semiconductor device 40. The flowing 20 is pushed down and becomes contact with the bottom wall 14 of the housing 11 by the carrying unit 52 of the handler 50. The preparation for testing the semiconductor device 40 is completed. Once the flowing 20 becomes contact with the bottom wall 14 of the housing 11, the downward moving of the carrying unit 52 together with the floating 20 is discontinued, while the test process for testing the semiconductor device 40 is started. In the test process, a test condition such as a sound test signal or an optical test signal is supplied through the communicating holes 16 and 24 to the functional unit 42 of the semiconductor device 40. In the test process, each of the terminals 43 of the semiconductor device 40 receives power input through a corresponding one of the contact frames 30. Each of the terminals 43 of the semiconductor device 40 also shows signal output through a corresponding one of the contact frames 30.

As described above, the semiconductor device 40 is mounted on the stage 21 of the floating 20 that is configured to be movable in the elevational direction, while the floating 20 is always kept to receive the upward elastic force by the coil springs 13. Each of the contact frames 30 is contactable withy a corresponding one of the terminals 43 of the semiconductor device 40. The contact frames 30 are deformed while the floating 20 pushes down the power points 38 of the contact frames 30. The floating 20 pushes the power points 38 of the contact frames 30, while the flexible portions 36 of the contact frames 30 are deformed, and the arm portions 32 of the contact frames 30 are rotated around the deforming flexible portions 36. The rotation of the arm portions 32 around the deforming flexible portions 36 moves the first branched arms 33 downwardly and inwardly so that each of the contact portions 37 becomes contact with a corresponding one of the terminals 43 of the semiconductor device 40. The downward motion of the floating 20 causes the rotational motion of the arm portions 32 around the deforming flexible portions 36. The sequential processes for mounting the semiconductor device 40 on the floating and subsequently pushing the floating 20 down toward the bottom wall 14 of the housing 11 cause that each of the contact portions 37 of the contact frames 30 becomes contact with a corresponding one of the terminals 43 of the semiconductor device 40.

The floating 20 has the communicating hole 24 which is aligned to the communicating hole 16 of the bottom wall 14 of the housing 11. When each of the contact portions 37 becomes contact with a corresponding one of the terminals 43 of the semiconductor device 40, the communicating hole 24 of the floating 20 is coupled to the communicating hole 16 of the bottom wall 14 of the housing 11. The functional unit 42 of the semiconductor device 40 that is mounted on the stage 21 of the floating 20 faces to the communicating hole 24 coupled with the communicating hole 16. Once each of the contact portions 37 becomes contact with a corresponding one of the terminals 43 of the semiconductor device 40, it is permitted to start the test process for testing the semiconductor device 40. The shot time and single processes need to start the test processes for testing the semiconductor device 40 that include the functional unit 42 on the opposing surface to the surface on which the terminals 43 are provided.

The rotational motion of the arm portions 32 around the deforming flexible portions 36 ensures that the first branched arms 33 are moved downwardly and inwardly so that each of the contact portions 37 becomes contact securely with a corresponding one of the terminals 43 of the semiconductor device 40. Secure contact of each of the contact portions 37 with a corresponding one of the terminals 43 of the semiconductor device 40 can ensure high accuracy in testing the semiconductor device 40.

The handler 50 is configured to perform the above-described two different functions. The first function is to carry the semiconductor device 40 and mount the semiconductor device 40 on the stage 21 of the floating 20. The second function is to move or rotate the contact frames 30 to have each of the contact portions 37 contact with a corresponding one of the terminals 43 of the semiconductor device 40. This can present the tester 10 from being increased in the number of parts and also from being complicated structurally, while realizing the reduction of the number of the test processes.

Second Embodiment

Figure 6:
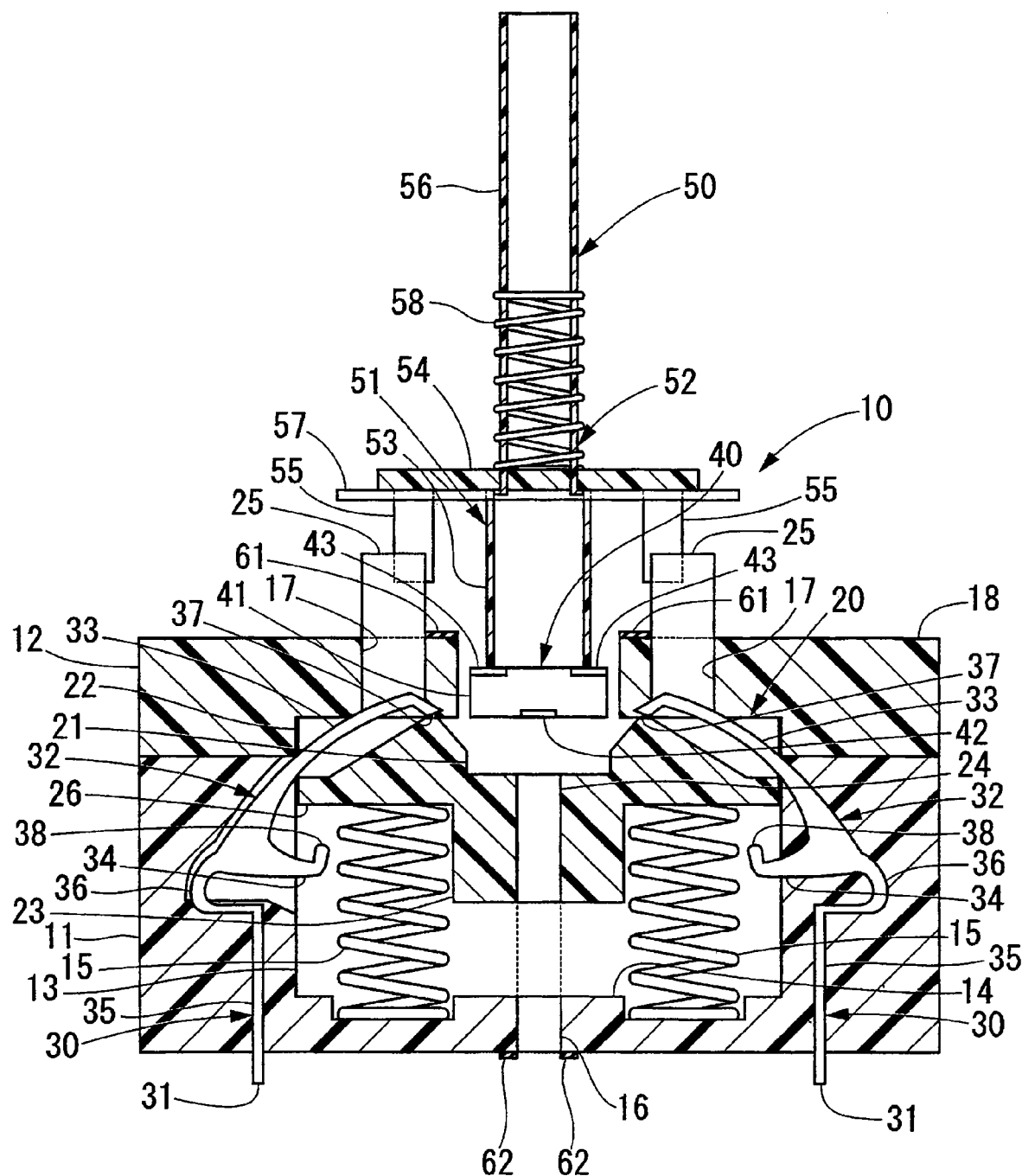
FIG. 6 is a cross sectional view illustrating a tester in accordance with a second preferred embodiment of the present invention.

FIG. 6 is a cross sectional view illustrating a tester in accordance with a second preferred embodiment of the present invention. A tester 10 of this embodiment is different from the above-described tester 10 of the first embodiment. The tester 10 of this embodiment includes all of the elements that are included in the above-described tester 10 of the first embodiment. The tester 10 of this embodiment further includes additional elements that are not provided in the above-described tester 10 of the first embodiment. The additional elements may be shielding members 61 and 62.

The shielding member 61 can be provided between the top surface 18 of the cover 12 and the bottom surface of the holder plate 57 so that the shielding member 61 can be sandwiched between the cover 12 and the holder plate 57 when the carrying unit 52 with the holder plate 57 goes down and the holder plate 57 is closer to the cover 12. The shielding member 61 that is sandwiched between the cover 12 and the holder plate 57 can shield sounds or light. The shielding member 61 can prevent that sounds or light enters through the gap between the holder plate 57 and the cover 12 into the inner space in which the semiconductor device 40 is present. The prevention of the entry of sounds or light can improve the accuracy in testing the semiconductor device 40. The shape and materials of the shielding member 61 can be determined in view of shielding sounds or light. For example, the shielding member 61 may be made of a flexible material such as a flexible resin.

The shielding member 62 can be provided on the periphery of the communicating hole 16 and on the bottom surface of the housing 11. The shielding member 62 can be sandwiched between the housing 11 and a pedestal that is not illustrated, when the tester 10 is mounted on the pedestal. The shielding member 62 that is sandwiched between the housing 11 and the pedestal can shield sounds or light. The shielding member 62 can prevent that sounds or light enters through the communicating holes 16 and 24 into the inner space in which the semiconductor device 40 is present. The prevention of the entry of sounds or light into the inner space can improve the accuracy in testing the semiconductor device 40. The shape and materials of the shielding member 62 can also be determined in view of shielding sounds or light. For example, the shielding member 62 may be made of a flexible material such as a flexible resin.

It is possible as a modification to further provide an additional shielding member between the bottom surface of the cylinder-shaped portion 23 of the floating 20 and the bottom wall 14 of the housing 11. The additional shielding member can be provided on the periphery of the communicating hole 16 and on the bottom wall 14 of the housing 11. The additional shielding member can be sandwiched between the bottom surface of the cylinder-shaped portion 23 of the floating 20 and the bottom wall 14 of the housing 11 when the floating 20 does down and becomes closer to the bottom wall 14 of the housing 11. The additional shielding member can prevent that sounds or light enters through the communicating hole 24 into the inner space in which the semiconductor device 40 is present. The prevention of the entry of sounds or light into the inner space can improve the accuracy in testing the semiconductor device 40. The shape and materials of the additional shielding member can also be determined in view of shielding sounds or light. For example, the additional shielding member may be made of a flexible material such as a flexible resin.

The shielding members 61 and 62 alone or in combination with the additional shielding member can improve the accuracy in testing the semiconductor device 40.

Third Embodiment

Figure 7:
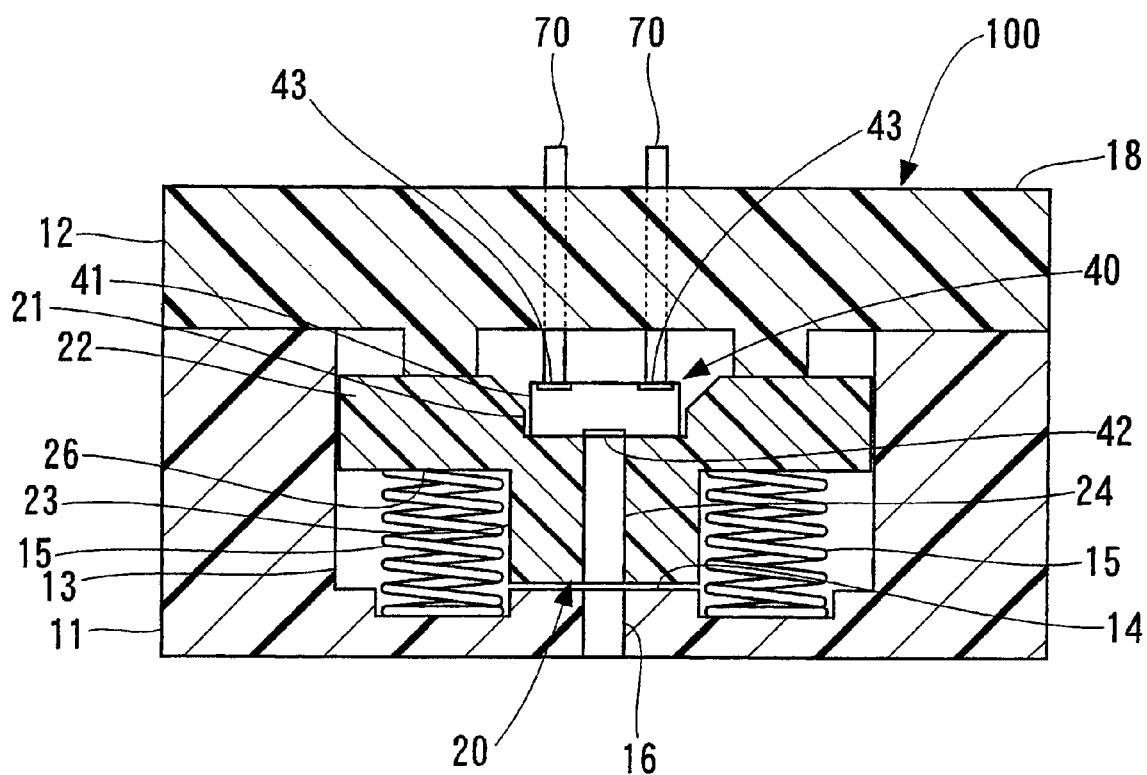
FIG. 7 is a cross sectional view illustrating a tester in accordance with a third preferred embodiment of the present invention.

FIG. 7 is a cross sectional view illustrating a tester in accordance with a third preferred embodiment of the present invention. A tester 100 is configured to test a semiconductor device 40. The tester 100 may include, but is not limited to, a housing 11, a cover 12, a floating 20, and electrodes 70 such as pogo pins. The housing 11 in combination with the cover 12 provides a container 13 that contains the floating 20. The floating 20 is configured to allow the semiconductor device 40 to be mounted thereon for performing a predetermined test for the semiconductor device 40. Namely, the floating 20 may perform as a stage 21 on which the semiconductor device 40 is mounted for performing the test for the semiconductor device 40.

The floating 20 has opposing first and second sides that are distanced in a direction vertical to surfaces of the semiconductor device 40. For example, the first side faces downwardly, while the second side faces upwardly as illustrated in FIG. 7. The floating 20 may include the stage 21 that is configured to allow the semiconductor device 40 to be mounted thereon. The stage 21 is positioned in the second side of the floating 20. The floating 20 may include a plate-shaped portion 22 and a cylindrically shaped portion 23. The plate-shaped portion 22 is positioned in the second side of the floating 20. The cylindrically shaped portion 23 is positioned in the first side of the floating 20. The plate-shaped portion 22 is positioned closer to the cover 12 than the cylindrically shaped portion 23. The cylindrically shaped portion 23 is positioned closer to the bottom portion of the housing 11 than the plate-shaped portion 22. The plate-shaped portion 22 has a depressed portion that performs as the stage 21 on which the semiconductor device 40 is mounted. The cover 12 covers the first side of the floating 20.

The floating 20 has a communicating hole 24 that extends from the stage 21 to the bottom of the cylindrically shaped portion 23. The communicating hole 24 is directed toward the bottom wall 14 of the housing 11. Namely, the communicating hole 24 penetrates the plate-shaped portion 22 and the cylindrically shaped portion 23 in the vertical direction.

The floating 20 is contained in an internal empty space of the container 13 that is provided by the combined housing 11 and cover 12. The floating 20 is supported by a supporter that is further supported by the housing 11 so that the floating 20 is movable in the vertical direction. There is a gap between the plate-shaped portion 22 and the inner wall of the housing 11 so as to allow the floating 20 to be movable in the vertical direction. The floating 20 can be mechanically supported on the bottom portion of the housing 11. For example, the floating 20 can be mechanically supported by one or more elastic-force applicators that apply an elastic force to the floating 20 toward the cover 12. The one or more elastic-force applicators can be realized by, but are not limited to, mechanical spring members such as coil springs 15. The coil springs 15 are provided between the plate-shaped portion 22 and the bottom wall 14 of the housing 11. Namely, the coil springs 15 each have first and second ends, wherein the second end contacts with the bottom surface of the plate-shaped portion 22 and the first end contacts with a bottom wall 14 of the housing 11. The coil springs 15 apply elastic force to the bottom wall 26 of the plate-shaped portion 22 of the floating 20 upwardly. Namely, the floating 20 is forced by the coil springs 15 upwardly so that the floating 20 is reciprocally movable in the vertical direction. Instead of the coil springs 15, any other supporter can be used which supports the floating 20 and allows the floating 20 to be reciprocally movable in the vertical direction.

The bottom wall 14 of the housing 11 has a communicating hole 16 which communicates between the inner space of the container 13 and the outside of the tester 10. The communicating holes 16 and 24 extend along a vertical axis which is virtual. The communicating hole 16 of the housing 11 is aligned to the communicating hole 24 of the floating 20. When the floating 20 becomes contact with the housing 11, the communicating holes 16 and 24 are coupled to each other, thereby forming a single communicating hole.

The cover 12 has a flat upper surface 18 and a lower surface that has projections. The projections extend downwardly from the cover 20 toward the floating 20. The projections contact with the upper surface of the plate-shaped portion 22 of the floating 20. The cover 12 is coupled with the housing 11, while the projections of the cover 12 push the floating 20 down.

A typical example of the test target may include, but is not limited to, the semiconductor device 40. The semiconductor device 40 has opposing first and second surfaces. The second surface faces upwardly or toward the cover 12, while the first surface faces downwardly or toward the stage 21 of the floating 20. The semiconductor device 40 may include a body 41, a function unit 42 that is disposed on the first surface thereof, and terminals 43 that are disposed on the second surface thereof. Namely, the function unit 42 is provided on the surface opposing to the surface on which the terminals 43 are provided.

The electrodes 70 such as pogo pins penetrate the cover 12. Each of the electrodes 70 has opposing first and second ends. The first end projects outside from the flat upper surface 18 of the cover 12. The second end projects into the internal empty space that is defined by the housing 11 and the cover 12. The second end of each of the electrodes 70 such as pogo pins contacts with a corresponding one of the terminals 43 of the semiconductor device 40.

The cover 12 may be coupled with the housing 11 via a hinge mechanism that is not illustrated. The cover 12 becomes close the housing 11, while each of the electrodes 70 such as pogo pins contacts with a corresponding one of the terminals 43 of the semiconductor device 40.

The semiconductor device 40 is mounted on the stage 21 of the floating 20, while the functional unit 42 of the semiconductor device 40 faces to the communicating hole 24 coupled with the communicating hole 16. The cover 12 closes over the housing 11, while the second end of each of the electrodes 70 such as pogo pins becomes contact with a corresponding one of the terminals 43 of the semiconductor device 40. Once each of the electrodes 70 such as pogo pins has contacted with a corresponding one of the terminals 43 of the semiconductor device 40, it is permitted to start the test process for testing the semiconductor device 40. The processes for mounting the semiconductor device 40 on the stage 21 of the floating 20 and subsequently making the cover 12 close over the housing 11 are necessary to start the test process. The shot time and single processes need to start the test processes for testing the semiconductor device 40 that include the functional unit 42 on the opposing surface to the surface on which the terminals 43 are provided.

As used herein, the following directional terms "upward, downward, vertical, horizontal," as well as any other similar directional terms refer to those directions of an apparatus equipped with the present invention. Accordingly, these terms, as utilized to describe the present invention should be interpreted relative to an apparatus equipped with the present invention.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An apparatus for testing a semiconductor device that has opposing first and second sides, the semiconductor device including at least one functional unit on the first side and a plurality of terminals on the second side, the functional unit detecting non-electrical conditions incident thereon, the apparatus comprising:

a mounting structure having at least one stage that is configured to allow the semiconductor device to be mounted thereon, the mounting structure having a communicating hole that penetrates the mounting structure from the stage, the communicating hole allowing the at least one functional unit to face the communicating hole while the semiconductor device is mounted on the stage, wherein non-electrical test conditions are applied to the at least one functional unit via the communicating hole;

a supporter that supports the mounting structure and allows the mounting structure to move housing in a direction vertical to the surface of the stage; and a plurality of electrodes, each of which is configured to be contactable to a corresponding one of the plurality of terminals while the semiconductor device is mounted on the stage, wherein each of the plurality of electrodes is configured to approach a corresponding one of the plurality of terminals by moving the mounting structure in the vertical direction, wherein each of the plurality of electrodes further comprises:

a flexible portion that is deformable, a first portion that has a power point, the first portion being connected to the flexible portion, the power point receiving mechanical force from the mounting structure, thereby deforming the flexible portion, and a second portion that has a contact portion, the second portion being connected to the flexible portion, wherein the contact portion of each of the plurality of electrodes is contactable with a corresponding one of the plurality of terminals while the flexible portion being deformed, and wherein the power point is pushed down by moving the mounting structure downwardly, so as to deform the flexible portion and rotate the first and second portions around the flexible portion, thereby causing the contact portion of each of the plurality of electrodes to become contact with a corresponding one of the plurality of terminals.

2. The apparatus according to claim 1, further comprising:
a cover that covers the semiconductor device that is mounted on the stage, the semiconductor device being positioned between the cover and the communicating hole.

3. The apparatus according to claim 1, further comprising:
a carrier that carries the semiconductor device to the stage, the carrier further causes the mounting structure to move in the vertical direction.

4. The apparatus according to claim 2, wherein the cover has the plurality of electrodes, each of the plurality of electrodes is contactable with a corresponding one of the plurality of terminals while the cover is disposed to cover the semiconductor device.

5. The apparatus according to claim 1, wherein the semiconductor device comprises a microphone and the non-electrical test conditions include a sound test signal.

* * * * *